United States Patent [19]

Moller et al.

[11] Patent Number: 5,555,157
[45] Date of Patent: Sep. 10, 1996

[54] ENCLOSURE FOR ELECTRONIC APPARATUS HAVING A COVER CATCH MEMBER ENGAGEABLE WITH TWO DIFFERENT HOUSING CATCH MEMBERS

[75] Inventors: Ronald J. Moller, Boulder Creek; Jonathan P. Ive, San Francisco, both of Calif.

[73] Assignee: Apple Computer, Inc., Cupertino, Calif.

[21] Appl. No.: 205,309

[22] Filed: Mar. 2, 1994

[51] Int. Cl.$^6$ ................................ G06F 1/16; H05K 5/00
[52] U.S. Cl. ...................... 361/683; 361/679; 312/223.2
[58] Field of Search .................................. 248/560, 27.1; 360/137; 364/708.1, 705.02; 312/223.2; 235/10; 361/680, 683, 679, 681; 206/305; 220/326, 241

[56] References Cited

U.S. PATENT DOCUMENTS

| | | | |
|---|---|---|---|
| 5,049,862 | 9/1991 | Dao et al. | 340/706 |
| 5,128,829 | 7/1992 | Loew | 361/380 |
| 5,253,142 | 10/1993 | Weng | 361/680 |
| 5,430,248 | 7/1995 | Levy | 174/50 |

OTHER PUBLICATIONS

Cohen, Raines, "Slimmed–Down MessagePad to Beef up RAM, Recognition," MacWEEK, Feb. 14, 1994, vol. 8, No. 7, pp. 1 & 84.

Primary Examiner—Michael W. Phillips
Assistant Examiner—Phuong T. Vu
Attorney, Agent, or Firm—Hickman, Beyer & Weaver

[57] ABSTRACT

An enclosure for an electrical apparatus includes a housing having top and bottom surfaces and a plurality of side surfaces, and an electrical apparatus, such as a pen-based computer, disposed within the housing such that the housing and the apparatus present a user interface region proximate to the top surface. A cover coupled to the housing by a compound hinge can be moved between a closed position substantially overlaying the user interface region and an open position substantially overlaying a portion of the bottom surface of the housing. The cover protects the user interface region when in the closed position and exposes the user interface region for use when in the open position. A cover catch member coupled to the cover engages a top-surface housing catch member when the cover is in the closed position, and the cover catch member engages a bottom-surface housing catch member at the open position. A release button, when activated, disengages the top-surface housing catch member from the cover catch member. The top-surface housing catch member includes a unitary latch structure that can be manufactured easily and with reduced cost.

27 Claims, 7 Drawing Sheets

ENCLOSURE FOR ELECTRONIC APPARATUS HAVING A COVER CATCH MEMBER ENGAGEABLE WITH TWO DIFFERENT HOUSING CATCH MEMBERS

BACKGROUND OF THE INVENTION

The present invention relates generally to enclosures for electrical apparatus, and more particularly to protective housings for portable computer apparatus.

Computerized personal organizers are becoming increasingly popular. They perform such functions as keeping a calendar, an address book, a to-do list, etc. While these functions can be provided by conventional computer systems, they are more conveniently provided by personal organizers which are relatively inexpensive, small, lightweight, and portable. Personal organizers are available from such companies as Sharp and Casio of Japan.

A relatively new form of computer, the pen-based computer system, holds forth the promise of a marriage of the power of a general purpose computer with the functionality and small size of a personal organizer. A pen-based computer system is typically a small, hand-held computer where the primary method for inputting data includes a "pen" or stylus. A pen-based computer system is commonly housed in a generally rectangular enclosure, and has a dual-function display assembly providing a viewing screen along one of the planar sides of the enclosure. The dual-function display assembly serves as both an input device and an output device. When operating as an input device, the display assembly senses the position and/or pressure of the tip of a stylus on the viewing screen and provides this positional information to the computer's central processing unit (CPU). When operating as an output device, the display assembly presents computer-generated images on the screen. Users can operate the computers as computerized notepads by moving the stylus across the surface of the screen. The CPU generates a corresponding image on the screen to create the illusion that the stylus is drawing (or "inking") the image directly upon the screen. With suitable recognition software, the "ink" can be identified as text and numeric information. An example of a pen-based computer, often referred to as a "personal digital assistant" or "PDA," is the Newton™ PDA made by Apple Computer, Inc. of Cupertino, Calif.

Pen-based computers and many other electrical apparatus are portable, and, as such, should be enclosed in durable, functional enclosures or housings. Pen-based computers currently available, as well as other portable electrical devices, include housings which provide an opening or aperture in which the input/output controls are exposed to allow access to them by the user. Such user interface areas are often fragile, however; for example, a glass or plastic display screen of a pen-based computer can be scratched or otherwise deformed, and can easily break if the computer is dropped or mishandled. To prevent some of this damage to fragile user interface areas and other areas, portable electronic devices are typically provided with a separate carrying case having padding or similar protective material. However, it is often inconvenient to store a separate carrying case when the device is in use, especially if the separate carrying case is made of inflexible, rigid material which is often needed for the protection of fragile devices.

What is needed is a housing for a portable computer or similar electrical apparatus which will protect fragile user interface areas of the device. The housing should be durable and easy to manufacture, and should allow quick and convenient access to the user input areas of the enclosed device.

SUMMARY OF THE INVENTION

The present invention addresses the problems in the prior art by providing an enclosure for an electrical apparatus which protects the entire apparatus, including fragile and sensitive user interface areas. More particularly, an enclosure of the present invention houses a pen-based computer or similar device and includes a cover which can be opened to allow a user access to user interface areas of the device and closed to protect the fragile user interface areas when the device is not being used.

An electrical apparatus and enclosure therefor of the present invention comprises a housing defining an internal volume and including top and bottom surfaces and a plurality of side surfaces, and an electrical apparatus disposed within the internal volume of the housing such that the housing and the apparatus provide a user interface region proximate to the top surface. The present invention further comprises a cover having a first portion coupled to the housing by a first hinge such that the cover can be moved between a closed position substantially overlaying the user interface region and an open position substantially overlaying a portion of the bottom surface of the housing. The cover protects the user interface region when in the closed position and exposes the user interface region for use when in the open position. The invention further includes a cover catch member coupled to a second portion of the cover, a first housing catch member coupled to the housing and operative to engage the cover catch member when the cover is in the closed position, and a second housing catch member coupled to the housing and operative to engage the cover catch member at the open position.

The electrical apparatus preferably comprises a digital electronic apparatus that includes a pressure sensitive screen and a plurality of buttons attached to the digital electronic apparatus that define the user interface region. The hinge is preferably a compound hinge comprising a first hinge assembly coupled to a second hinge assembly by a linking portion, the first hinge assembly being coupled to the cover and the second hinge assembly being coupled to a side surface of the housing. The invention preferably further comprises a release button coupled to the first housing catch member which, when activated, is operative to disengage the first housing catch member from the cover catch member.

A latch mechanism of the present invention comprises a support and a unitary structure coupled to the support. The unitary structure includes a button portion, a lever portion, a first linkage portion coupling the button portion to a first end of the lever portion, a first catch portion, and a second linkage portion coupling the first catch portion to a second end of the lever portion. The latch mechanism further comprises a fulcrum coupled to the support and engaging a section of the lever portion between the first end and the second end of the lever and a second catch portion coupled to the support and engagable with the first catch portion. When force is applied to the button to move the button from a neutral position, the lever portion pivots on the fulcrum to move the first catch portion in a direction substantially opposite to the direction that the button is moved, thereby disengaging the first catch portion from the second catch portion.

The first linkage portion of the latch mechanism is preferably coupled to the lever portion by a spring hinge which urges the button to its neutral position and the first catch portion to a latching position in the absence of a force on the button. The latch mechanism preferably further comprises a second lever portion and a second fulcrum symmetrically disposed relative to the other lever portion and fulcrum around a central axis of the unitary structure. The first catch portion preferably includes a tongue and the second catch portion preferably includes a groove engagable with the tongue. The first linkage portion and second linkage portion are preferably provided with guide slots, and guide pegs are preferably coupled to the support and engagable with the respective guide slots, whereby the directions in which the unitary structure may move are constrained.

The present invention provides a protective enclosure for a pen-based computer or other electrical apparatus which protects fragile user interface areas with a movable cover that can be secured in an open or closed position. The latch mechanism of the present invention includes a unitary structure that can be manufactured easily and with reduced cost.

These and other advantages of the present invention will become apparent to those skilled in the art upon a reading of the following specification of the invention and a study of the several figures of the drawing.

DETAILED DESCRIPTION OF THE PREFERRED EMBODIMENT

The present invention is well suited for portable pointer-based computer systems such as the pen-based or pen-aware systems that are currently popular. For the purposes of illustration, the invention will be described in connection with a pen-based computer system. However, the present invention is also suitable for other types of portable electrical apparatus, such as keyboard-based computers, electronic calculators, game devices, portable test equipment, and other electrical devices having a user interface region suitable for protection by a cover.

Figure 1:
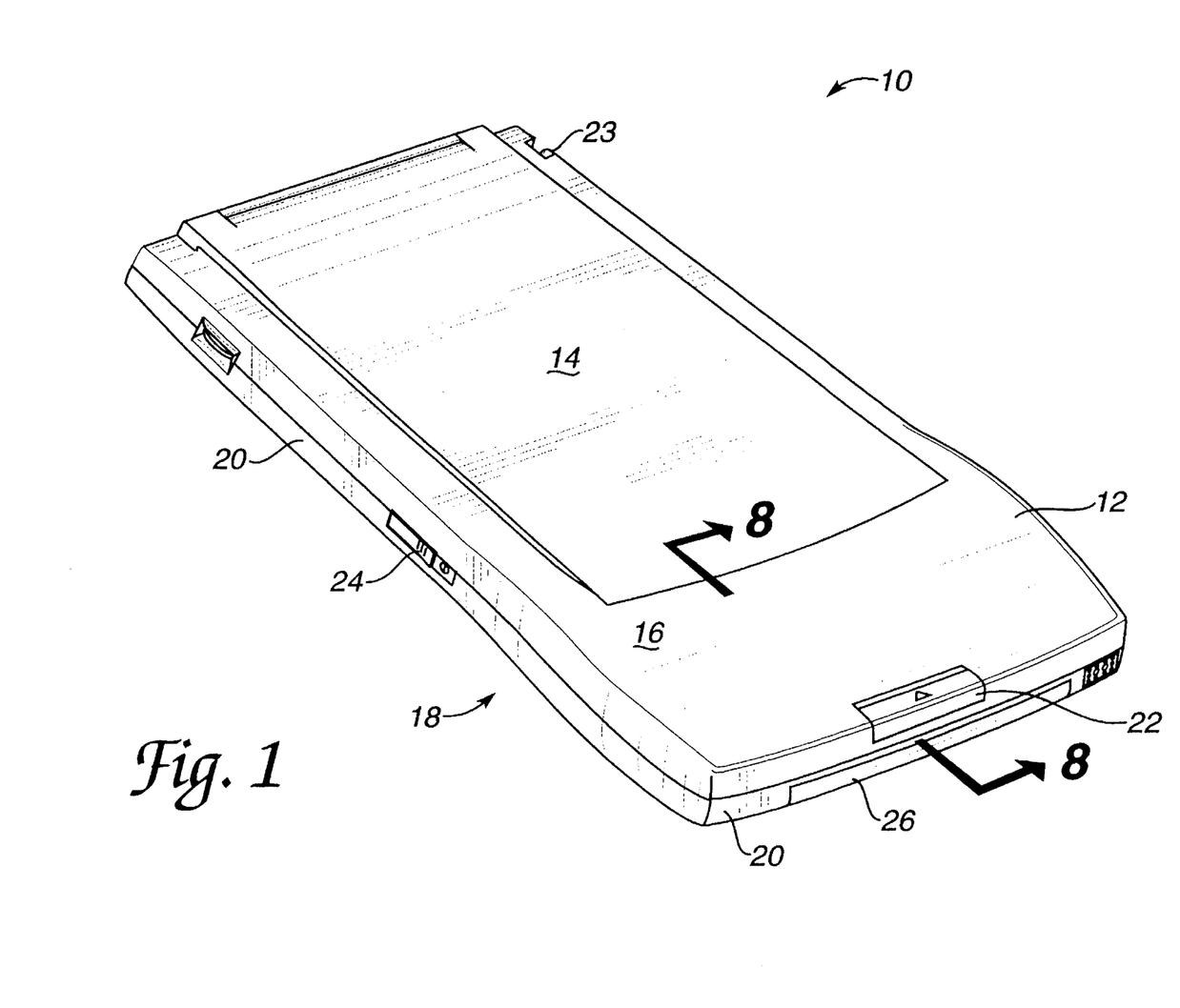
FIG. 1 is a perspective view of an enclosure for an electrical apparatus in accordance with the present invention.

As shown in FIG. 1, an enclosure 10 for an electrical apparatus, such as a pen-based computer, in accordance with the present invention includes a housing 12 and a cover 14. Housing 12 includes a top surface 16, a bottom surface 18, and several side surfaces 20. The housing is preferably made out of durable, non-conductive plastic, but can also be made from other materials suitable for protecting a portable electrical apparatus, such as metal alloys, hardened rubber, etc. Cover 14 is made from material similar to that of housing 12, and is used to protect a user interface region coupled to a pen-based computer or other electrical apparatus housed in enclosure 10. Cover 14 is shown in a closed, protective position in FIG. 1, and can be moved to an open position to allow access to the user interface region of the enclosed electrical apparatus, as detailed with reference to FIG. 2.

Enclosure 10 is well suited to house a pen-based computer, which can be implemented in several ways. A typical pen-based computer includes such standard components as a microprocessor, read-only memory (ROM), random access memory (RAM), and an input/output interface. These components can be supported within enclosure 10 by a printed circuit board or similar support surface. Implementation of such a computer is well known to those skilled in the art.

Figure 2:
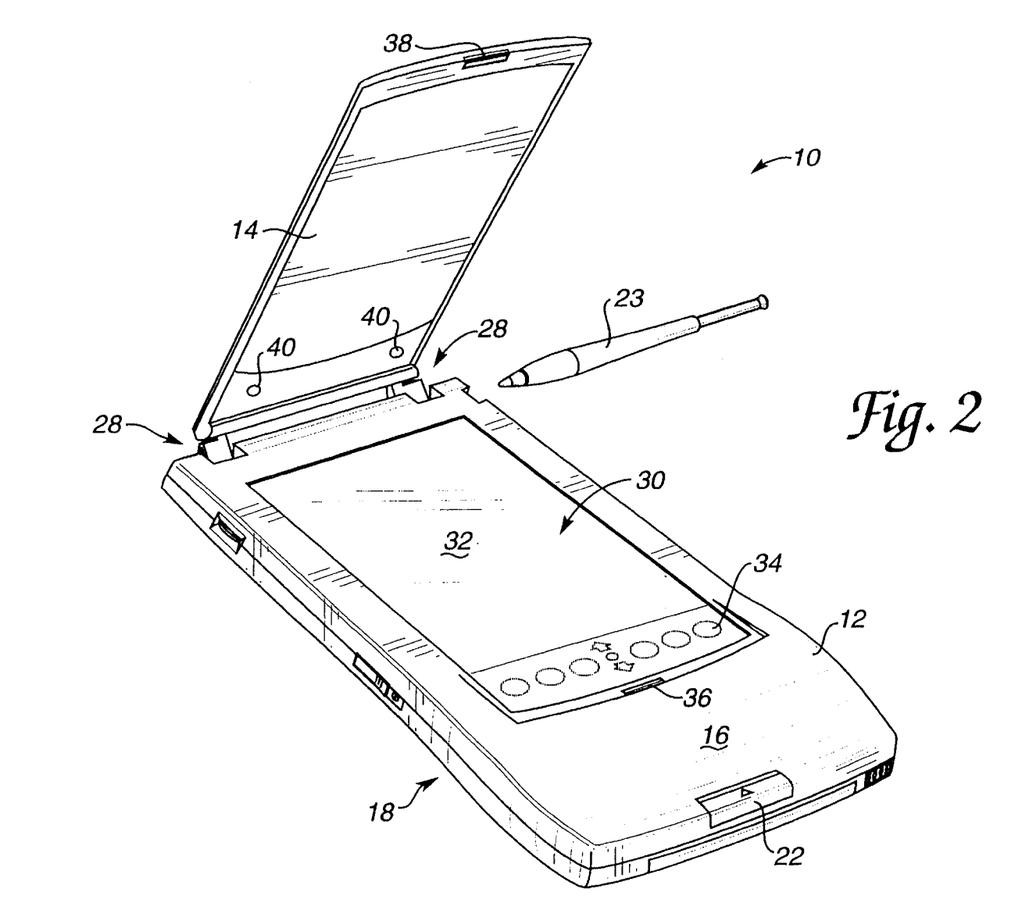
FIG. 2 is a perspective view of the enclosure of FIG. 1 with the cover partially open.

With additional reference to FIG. 2, enclosure 10 includes a button 22 provided on the top surface 16/side surface 20 which is operative to release cover 14 from its closed position as shown in FIG. 1. The operation of releasing cover 14 from its closed position with release button 22 is described in more detail with reference to FIG. 8. In the described embodiment, a stylus 23 is held in an aperture within housing 12 and can be removed from the housing to input pen strokes for the pen-based computer. Power switch 24 is operative to turn on the pen-based computer (or other electrical apparatus) disposed within the enclosure 10. Battery compartment cover 26 is provided to secure a power source, such as a number of batteries, within a compartment, and is located on the bottom surface of housing 12 in the described embodiment. Other controls and features typically included on a pen-based computer and its enclosure include a communication port (shown in FIGS. 6 and 7) for sending and/or receiving signals, for example, to control a printer or some other external device, or to communicate with other computer systems or other devices. A speaker (not shown) is typically included in housing 12 to provide user feedback such as sound effects, alarms, etc. A microphone can also be included to receive user voice input. Various input/output ports and a storage port for memory cards or other long term mass storage such as a commercially available miniature hard disk drive, nonvolatile memory such as flash memory, battery backed RAM, or the like can also be included in the enclosed pen-based computer and the enclosure 10.

FIG. 2 is a perspective view of the enclosure 10 wherein cover 14 has been partially opened using button 22. Cover 14 is movable from top surface 16 of housing 12 to bottom surface 18 of housing 12 using hinge 28, which is described in greater detail with reference to FIG. 3. Underneath cover 14 is a user interface region 30 used to interface, for with a pen-based computer housed in enclosure 10. In the described embodiment, user interface region 30 includes a display assembly which includes a display screen 32 and a number of buttons 34. Display screen 32 of pen-based computer system 10 is both an input and an output device. The screen (output device) for display screen 32 is preferably a liquid crystal display (LCD) of the type commercially available from a variety of vendors. The input device of display screen 32 is preferably a thin, clear membrane which covers the LCD display and which is sensitive to the position of a stylus 23 on its surface. With such a structure, the membrane of the display screen 32 can serve as an input "tablet." These position sensitive membranes are also readily available on the commercial market. Alternatively, other types of tablets can be used, such as inductively coupled tablets. Combination display screens such as display screen 32 which include both the LCD and the input membrane are commercially available from such vendors as Scriptel Corporation of Columbus, Ohio.

Buttons 34 can comprise an array of mechanical buttons or switches. Alternatively, buttons 34 could, for example, comprise an entire, standard QWERTY keyboard. In a preferred embodiment, buttons 34 include "button" areas which are associated with a bottom edge of the tablet membrane that extends beyond the lower edge of the LCD display. These button areas are defined by a printed or silk-screened icons which can be seen through the transparent membrane of the input tablet. When the "buttons" are selected by engaging the stylus 38 with the membrane over these printed icons, the membrane senses the pressure and communicates that fact to the CPU of the pen-based computer. Alternatively, a button keypad could comprise a mechanical keypad (or keyboard) or "soft buttons" i.e. images generated at convenient locations on the display screen 32, in which case a "button" would be activated by touching the stylus to the screen over the image of the button.

The described user interface region is preferably accessed using a stylus, such as stylus 23. However, other pointing devices such as a computer mouse, a track ball, or a tablet can be used to manipulate a pointer on a display screen of a computer housed in enclosure 10. In addition, other electrical apparatus and user interfaces can be used. For example, a keyboard, a game controller, or speaker/microphone can be placed in user interface region 30 to be protected by cover 14 and used to access an enclosed electrical apparatus.

The housing 12 and pen-based computer enclosed in the housing present the user interface region 30. In the described embodiment, region 30 is provided as a component of the pen-based computer, and housing 12 is a separate unit assembled around the pen-based computer. Display screen 32 and buttons 34 are coupled to an input/output interface of the pen-based computer, for example, and are coupled to a circuit board which supports the components of the pen-based computer. To allow access to user interface region 30, housing 12 includes an aperture through which region 30 is exposed. Cover 14 is coupled to housing 12 and overlays user interface region 30 when in its closed position.

Alternatively, user interface region 30 can be included as part of housing 12. For example, display screen 32 can be attached to housing 12 and be considered a component of the housing. A pen-based computer or other electrical device can be provided as a separate unit inside the housing which is coupled to the display screen to receive input therefrom.

When in its closed position (as shown in FIG. 1), cover 14 is secured by the use of a latch mechanism. FIG. 2 shows a housing catch member 36 which is positioned on the top surface 16 of housing 12. Housing catch member 36 is coupled to button 22 and is operative to engage a cover catch member 38 preferably positioned on the end portion of cover 14. When button 22 is pushed, housing catch member disengages from cover catch member 38 and cover 14 can then be opened by the user. Cover 14 also preferably includes one or more spring members 40 preferably located on the underside of cover 14 close to hinge 28. Alternatively, spring members 40 can be positioned on top surface 16 of housing 12. Spring members 40 are springs preferably covered with flexible rubber or similar material operative to compress when they contact top surface 16 of housing 12 when cover 14 is in a closed position. Spring members 40 thus provide a force to cover 14 in a direction away from top surface 16 such that a tension is produced between cover catch member 38 and housing catch member 36 and cover 14 is tightly secured in the closed position. Spring members 40 also are operative to move cover 14 in a direction away from top surface 16 when housing catch member 34 is disengaged from cover catch member 38. The operation of spring members 40 is described in more detail with reference to FIGS. 3–5.

Cover 14 is typically opened as shown in FIG. 2 and is moved to an open position, in which cover 14 is preferably overlaying a portion of the bottom surface 18 of housing 12. The cover can preferably be secured in the open position by a catch member of a second latch mechanism positioned on the bottom surface 18, which is described in more detail with reference to FIG. 14. Once cover 14 is placed in an open position, stylus 23 is typically removed from an aperture in housing 12 to draw "ink" strokes on the display screen 32 of the enclosed pen-based computer. Stylus 23 can also be used to select one of the buttons of button panel 34.

Figures 3, 4:
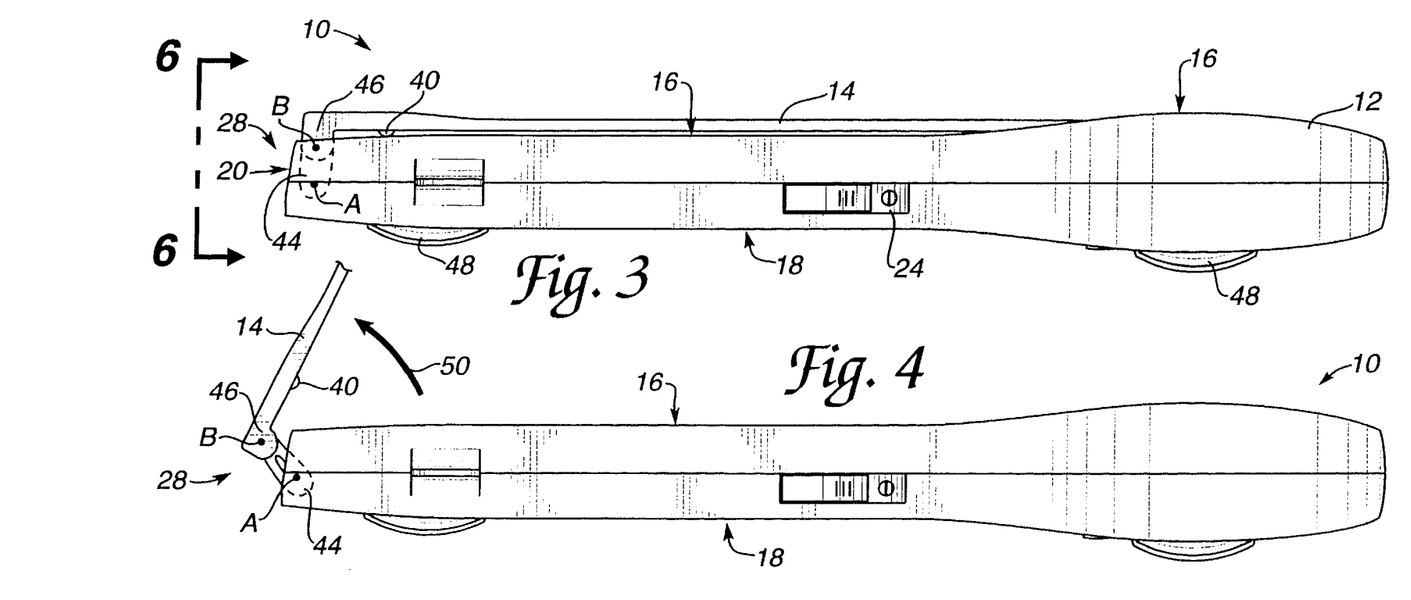
FIG. 3 is a side elevational view of the enclosure of FIG. 1.
FIG. 4 is a side elevational view of the enclosure of FIG. 2.

FIG. 3 is a side elevational view of enclosure 10 and the pen-based computer as shown in FIG. 1, wherein cover 14 is in a closed position. Hinge 28 is preferably a compound hinge which includes hinge assembly 44, linking portion 45 (shown in FIGS. 6 and 7), and hinge assembly 46. Hinge assembly 44 is coupled to the side surface 20 of housing 12 and is operative to move about an axis A. Two recesses are preferably provided in side surface 20 to hold hinge assembly 44 such that hinge assembly 44 is flush with side surface 20 when cover 14 is in either the open or closed position. Axis A can be implemented with a metal rod coupling hinge assembly 44 to enclosure 10 and is preferably positioned on side surface 20 about midway between top surface 16 and bottom surface 18. Hinge assembly 46 is coupled to cover 14 and hinge assembly 44 and is operative to move about axis B, which is similar to axis A. With the compound hinge structure shown, cover 14 can easily and smoothly move from a closed position on top surface 16 to an open position overlaying a portion of bottom surface 18.

Spring members 40 are shown compressed against the top surface 16 of housing 12, causing cover catch member 38 to be pressed against housing catch member 36 in a direction away from the top surface. Also shown in FIG. 3 are feet 48, which are provided on bottom surface 18 of housing 12 to support enclosure 10 when placed on a surface and to prevent enclosure 10 from slipping or moving. Feet 48 are preferably positioned close to the outer edges of bottom surface 18 to allow cover 14 to be positioned close to bottom surface 18 between feet 48.

FIG. 4 is a side elevational view of enclosure 10 and the pen-based computer as shown in FIG. 2, wherein cover 14 has been partially opened. The user has pressed button 22 and rotated cover 14 about axes A and B in the direction of arrow 50.

Figure 5:
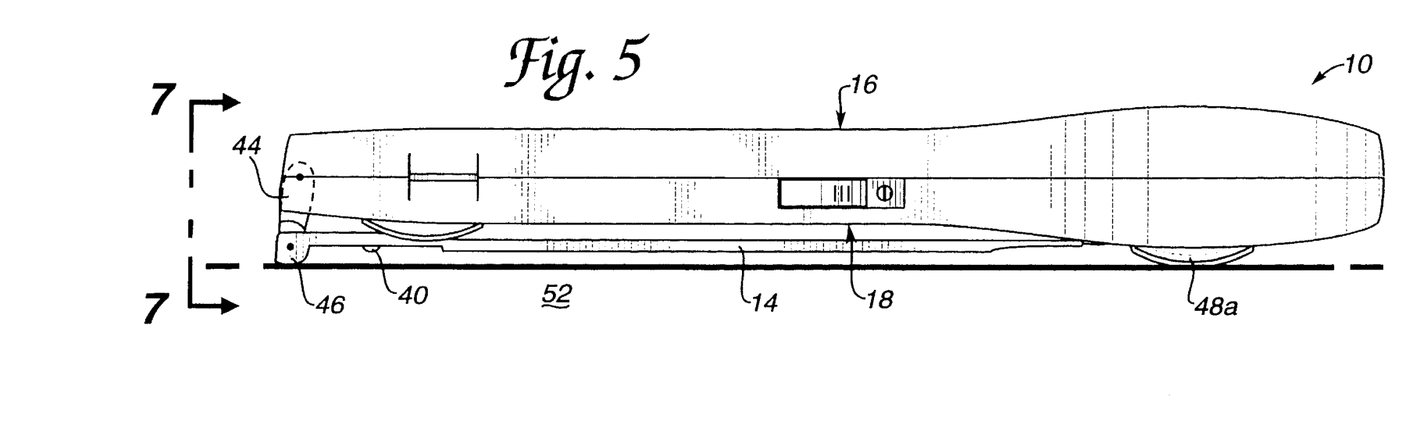
FIG. 5 is a side elevational view of the enclosure with the cover in the open position and engaging a support surface.

FIG. 5 is a side elevational view of enclosure 10 and the pen-based computer wherein cover 14 has been moved to its open position. Cover 14 is shown overlaying a portion of bottom surface 18. Cover catch member 38 is engaged with a housing catch member (shown in FIG. 14) located on the bottom surface 18 to prevent cover 14 from moving. When cover 14 is in the open position, enclosure 10 preferably rests on surface 52 supported by two feet 48a located at one end of the enclosure and also supported by hinge assembly 46 located at the other end of the enclosure.

Figure 6:
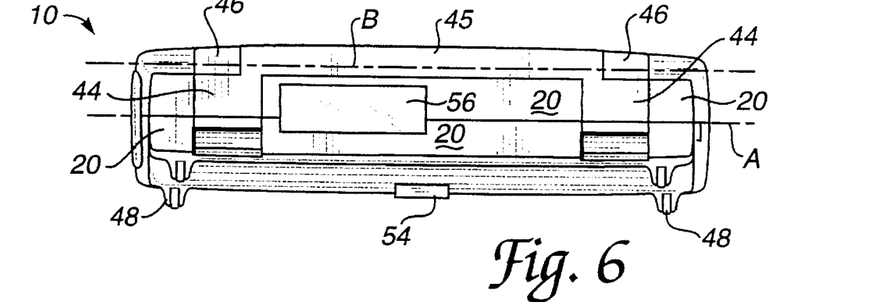
FIG. 6 is a side elevational view taken along line 6—6 of FIG. 3 with a cover of the enclosure closed.

FIG. 6 is a side elevational view of enclosure 10 taken along line 6—6 of FIG. 3. Enclosure 10 is shown with cover 14 in a closed position as shown in FIGS. 1 and 3. Hinge assembly 44 is shown coupled to axis A. A linkage portion 45 of hinge 28 is coupled between hinge assembly 44 and hinge assembly 46. A portion of side surface 20 is exposed so that communication port 56 can be used to send and receive information. In the described embodiment, communication port 56 is an infrared port operative to send and receive infrared beams of light to and from other computers and electronic devices. Other types of communication ports can also be used, such as a visible light port, a sound port (microphone/speaker), or an antenna for transmission and reception of electromagnetic signals. Also shown in FIG. 6 is housing catch member 54 located on the bottom side 18 of housing 12 for securing the cover 14 in the open position.

Figure 7:
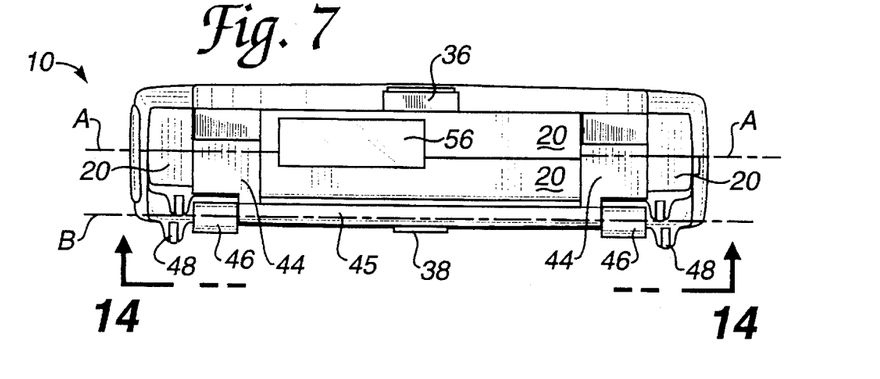
FIG. 7 is a side elevational view taken along line 7—7 of FIG. 5 with the cover of the enclosure open.

FIG. 7 is a side elevational view of enclosure 10 taken along line 7—7 of FIG. 5. Enclosure 10 is shown with cover 14 in an open position. Hinge assemblies 44 and 46 have been rotated such that axis B is positioned near bottom surface 18 of housing 12. The portion of side surface 20 exposed when cover 14 is closed is also exposed when cover 14 is in the open position, thus allowing communication port 56 to function both when the pen-based computer or other electrical apparatus is being used and when it is not being used.

Figure 8:
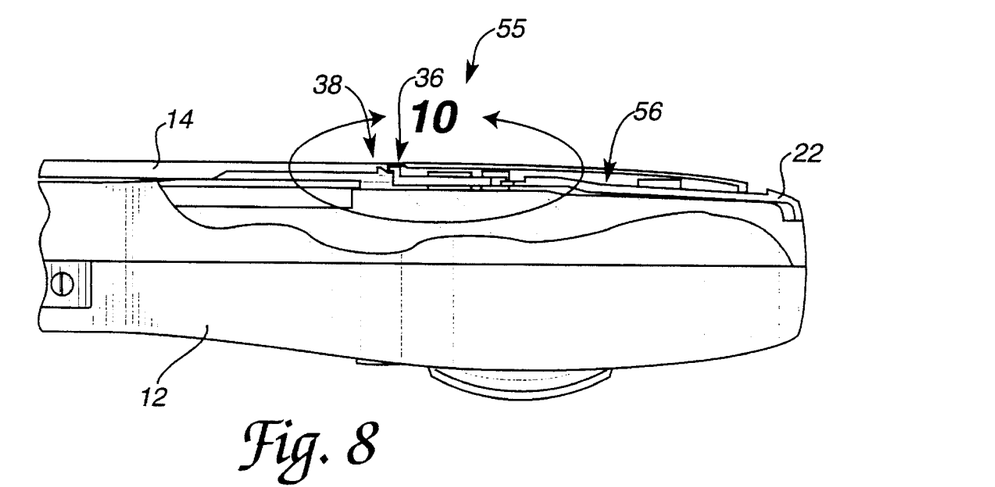
FIG. 8 is a side sectional view of the enclosure taken along line 8—8 of FIG. 1.

FIG. 8 is a side sectional view of a top surface latch mechanism 55 taken along line 8—8 of FIG. 1. Cover catch member 38 is engaged with housing catch member 36 to secure the cover in a closed position. Release button 22 is coupled to housing catch member 36 and is considered part of a unitary latch member 56. Unitary latch member 56 is described in more detail with reference to FIG. 10. Button 22 is shown in a neutral position when no force is applied to the button.

Figure 9:
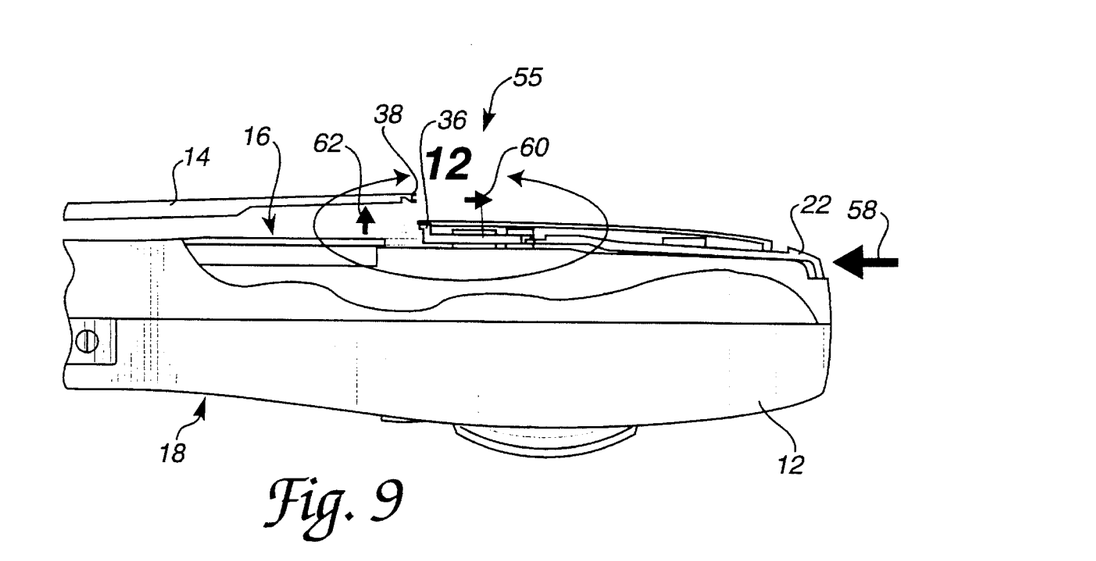
FIG. 9 is a side elevational view of the enclosure similar to FIG. 8 with the cover disengaged from the housing.

FIG. 9 is a side section view of latch mechanism 55 similar to the view of FIG. 8. In FIG. 9, release button 22 has been pressed by a user in a direction towards housing catch member 36 as indicated by arrow 58. In response to this action, housing catch member 36 moves away from cover catch member 38, preferably in a direction towards button 22 as indicated by arrow 60. Cover catch member 38 is thus disengaged from housing catch member 36, and cover 14 moves away from top surface 16 as indicated by arrow 62 due to the tension caused by spring members 40 (not shown).

When the user removes pressure from release button 22, the button returns to its neutral position and housing catch member 36 returns to a corresponding rest position. The user can now move cover 14 to the bottom side 18 to latch cover 14 in the open position. The operation of unitary latch member 56 when button 22 is pressed is described in more detail with reference to FIG. 12.

Figure 10:
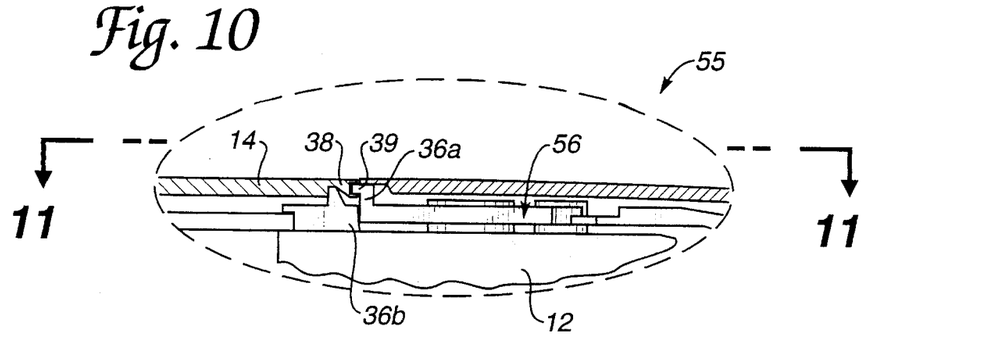
FIG. 10 is a side sectional view of the latch mechanism with the cover in a closed position.

FIG. 10 is a side sectional view of the top surface latch mechanism 55 of the present invention. Housing catch member 36 preferably includes a tongue 36a which is operative to engage a groove 39 provided in cover catch member 38. Housing catch member 36 also preferably includes a support catch 36b, which is positioned below cover catch member 38 and is operative to support cover 14 in the closed position. In an alternate embodiment, housing catch member includes a groove and cover catch member includes a tongue such that the catch members are engagable.

Figure 11:
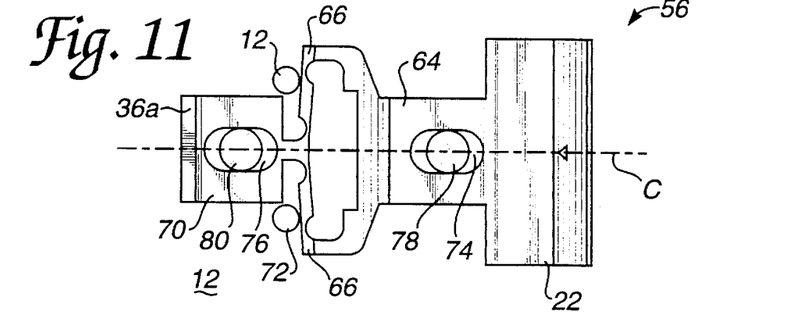
FIG. 11 is a top plan view of a unitary latch member of the present invention taken along line 11—11 of FIG. 10.

FIG. 11 is a top plan view of unitary latch member 56 taken along line 11—11 of FIG. 10. Unitary latch member 56 is preferably made out of a single piece of plastic and includes release button 22, button linkage portion 64, spring hinges 66, levers 68, tongue linkage portion 70, and tongue 36a. Button 22 is coupled to spring hinges 66 by button linkage portion 64. Each spring hinge is coupled to a lever 68, and the levers 68 are coupled to tongue 36a by tongue linkage portion 70. Each lever 68 engages a corresponding fulcrum 72 that is attached to housing 12; a fulcrum engages a corresponding lever 68 at a point on the lever between the spring hinge 66 and the connection to the tongue linkage portion 70. Button linkage portion 64 and tongue linkage portion 70 also preferably include slots 74 and 76, respectively, defined in the linkage portions. Guide pin 78 is coupled to housing 12 and is engagable with slot 74. Guide pin 80 is coupled to housing 12 and is engagable with slot 76. The guide pins and slots are operative to constrain the movement of the button 22 and the tongue 36a in directions along axis C.

Figure 12:
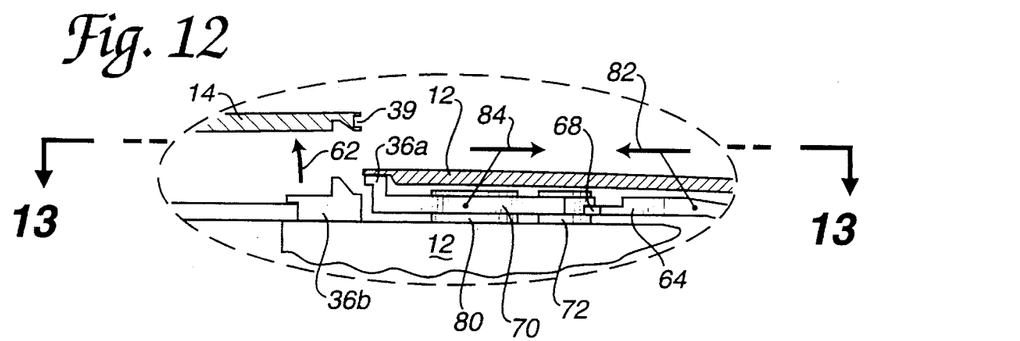
FIG. 12 is a side sectional view of the latch mechanism similar to FIG. 10 with the cover disengaged from the housing.

FIG. 12 is a side sectional view of the latch mechanism 55 on top surface 16 of housing 12 disengaging the cover catch member from the housing catch member. Release button 22 (not shown) has been pushed by the user. Button linkage portion 64 moves in the direction indicated by arrow 82 as button 22 is pressed. Levers 68 turn about fulcrums 72 to cause tongue 36a and tongue linkage portion 70 to move in a direction indicated by arrow 84. When tongue 36a moves in this direction, it is removed from groove 39 of cover catch member 38 and cover 14 moves upward as indicated by arrow 62.

Figure 13:
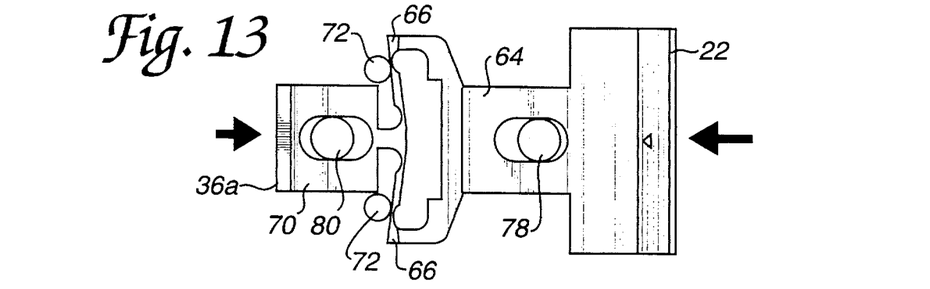
FIG. 13 is a top plan view of the unitary latch member taken along line 13—13 of FIG. 12.

FIG. 13 is a top plan view of unitary latch member 56 after button 22 has been pressed. Levers 68 are engaged by corresponding fulcrums 72. The fulcrums force the end of the levers attached to the tongue linkage portion 70 to move towards button 22. Since tongue 36a and tongue linkage portion 70 are attached to this end of the levers, they also move towards the button to cause the tongue to disengage from the groove 39. Linkage portions 64 and 70 move in their respective directions as constrained by guide pegs 78 and 80, respectively.

When button 22 is released by the user, spring hinges 66 cause the lever 68 end attached to tongue linkage portion 70 to move back towards tongue 36a. Similarly, the lever end attached to spring hinge 66 is caused to move back towards button 22, which causes button linkage portion 64 and button 22 to move back to the neutral position of button 22 as shown in FIG. 11.

Figure 14:
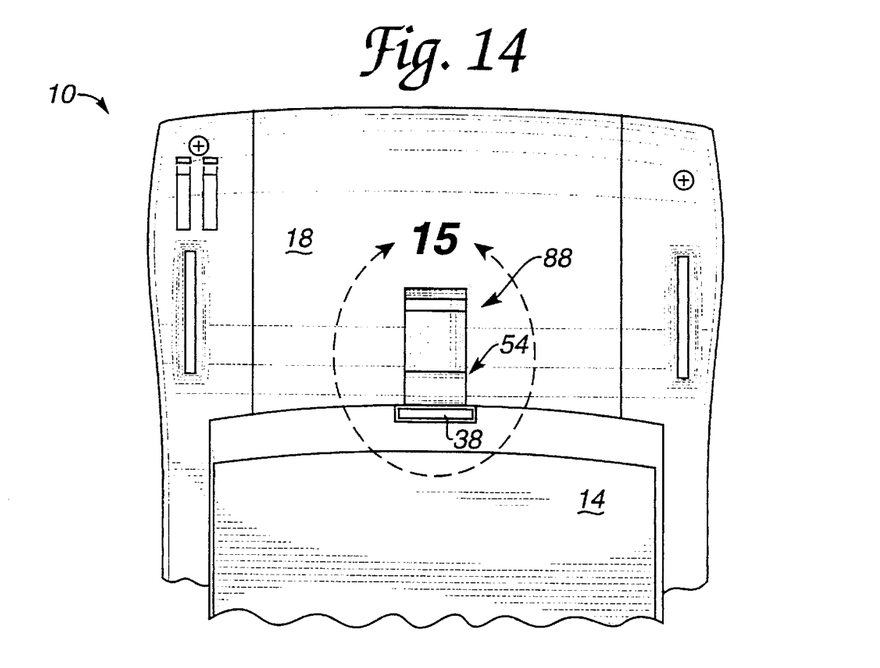
FIG. 14 is a bottom plan view of a portion of the enclosure and the latch mechanism on the bottom surface.

FIG. 14 is a bottom plan view of a portion of bottom surface 18 of housing 12. Cover 14 is shown in the open position. Latch mechanism 88 is located on bottom surface 18 and includes a housing catch member 54 engaged with cover catch member 38. The operation of housing catch member 54 is described in more detail with reference to FIGS. 15–19.

Figure 15:
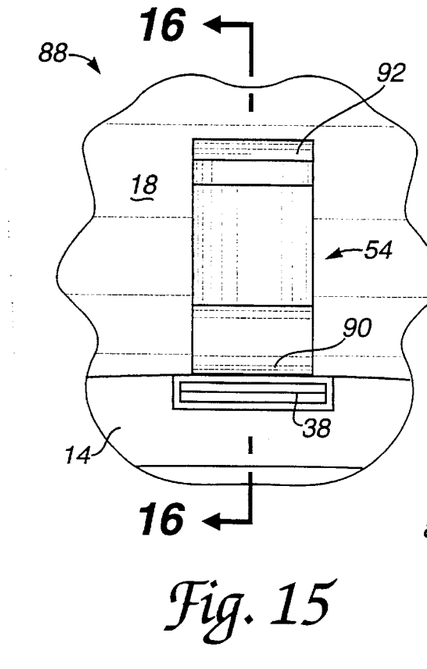
FIG. 15 is a bottom plan view of the latch mechanism of FIG. 14.
Figure 16:
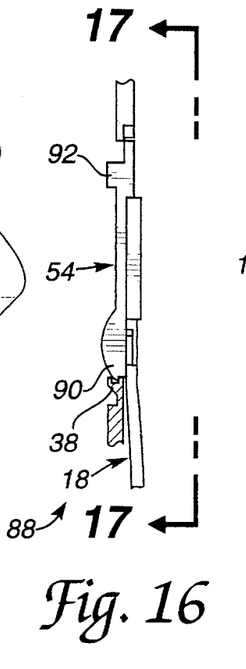
FIG. 16 is a side sectional view of the latch mechanism taken along line 16—16 of FIG. 15.

FIG. 15 is a detailed bottom plan view of latch mechanism 88 located on bottom surface 18 of enclosure 10. FIG. 16 is a side sectional view of the latch mechanism taken along line 16—16 of FIG. 15. Housing catch member 54 is preferably made of plastic or a similar rigid material and preferably includes a tongue portion 90 and a handle portion 92.

Figure 17:
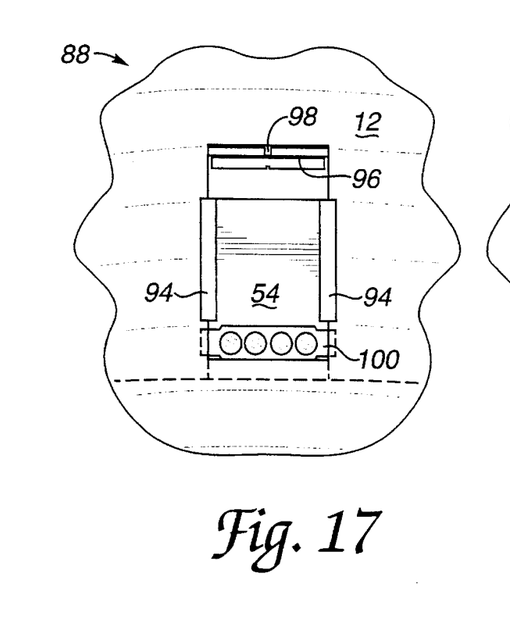
FIG. 17 is a top plan view of the latch mechanism taken along line 17—17 of FIG. 16.

FIG. 17 shows a top plan view of latch mechanism 88 taken along line 17—17 of FIG. 16. Housing catch member 54 is held by two guides 94 attached to the housing 12. Resilient member 96 is coupled to catch member 54 and is shown in a neutral position next to fulcrum 98 which is attached to the housing 12. Stop 100 is coupled to catch member 54 and is operative to prevent catch member 54 from moving more than a specific distance in a direction towards or away from fulcrum 98.

Figure 18:
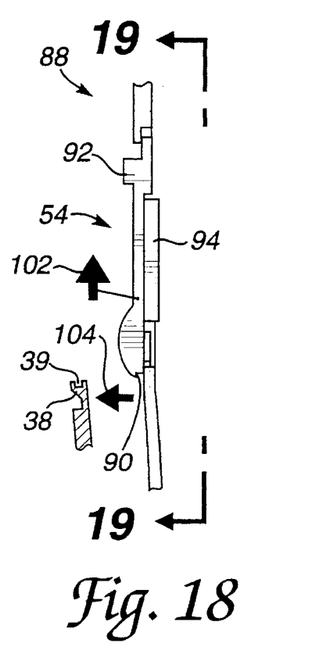
FIG. 18 is a side sectional view of the latch mechanism of FIG. 16 wherein the cover is disengaged from the housing.
Figure 19:
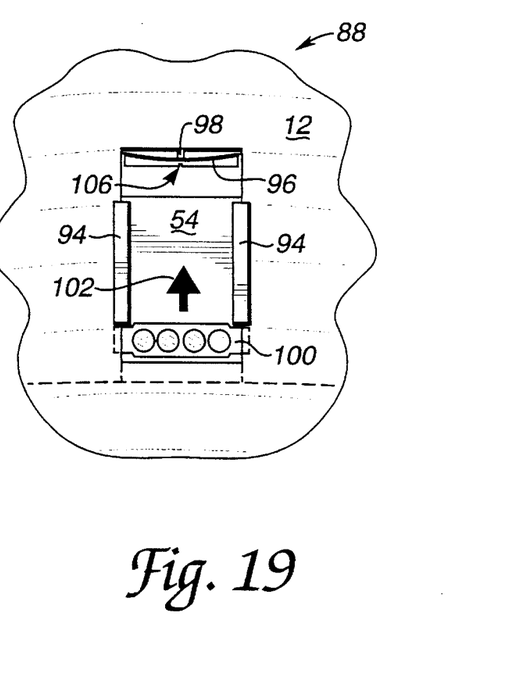
FIG. 19 is a top plan view of the latch mechanism taken along line 19—19 of FIG. 18.

The operation of latch mechanism 88 is shown in FIGS. 18 and 19. FIG. 18 shows a side sectional view of the latch mechanism similar to FIG. 16 wherein the housing catch member 54 is disengaged from cover catch member 38. FIG. 19 shows a top plan view of the latch mechanism taken along line 19—19 of FIG. 18. A user preferably moves the cover to the bottom side of enclosure 10 and pushes the cover until groove 39 of cover catch member 38 engages tongue 90. The cover is thus secured in the open position. To return cover 14 to the closed position, the user slides handle portion 92 in the direction of arrow 102 so that tongue portion 90 moves in the same direction and disengages from cover catch member 38. Resilient member 96 (FIG. 19) engages fulcrum 98 and bends until edge 106 contacts resilient member 96 and stops the movement of catch member 54. Stop 100 may also engage guides 94 to stop the movement of catch member 54. The user can then move cover 14 in the direction of arrow 104 to the top side of enclosure 10 and secure the cover in the closed position. When the user releases catch member 54, resilient member 96 moves back to its original position and causes catch member 54 to move in a direction opposite to arrow 102 to return to its neutral position as shown in FIGS. 16 and 17.

Other types of latch mechanisms can be used for latch mechanism 88. If desired, a latch similar to latch mechanism 55 can be used on bottom surface 18 as well as top surface 16 of enclosure 10. Release button 22 can be used to release cover 14 from the open position as well as the closed position. Alternatively, a second button similar to button 22 can be used to release the cover from the open position.

While this invention has been described in terms of several preferred embodiments, it is contemplated that alterations, modifications and permutations thereof will become apparent to those skilled in the art upon a reading of the specification and study of the drawings. Furthermore, certain terminology has been used for the purposes of descriptive clarity, and not to limit the present invention. It is therefore intended that the following appended claims include all such alterations, modifications and permutations as fall within the true spirit and scope of the present invention.

What is claimed is:

1. An electrical apparatus and enclosure therefor comprising:
    a housing including top and bottom surfaces and a plurality of side surfaces, said housing defining an internal volume;
    an electrical apparatus disposed within said internal volume of said housing such that said housing and said apparatus provide a user interface region proximate to said top surface;
    a cover having a first portion coupled to said housing by a hinge such that said cover can be moved between a closed position substantially overlaying said user interface region and an open position substantially overlaying a portion of said bottom surface of said housing, whereby said cover protects said user interface region when in said closed position and exposes said user interface region for use when in said open position;
    a cover catch member coupled to a second portion of said cover;
    a first housing catch member coupled to said housing and operative to engage said cover catch member when said cover is in said closed position; and
    a second housing catch member coupled to said housing and operative to engage said cover catch member at said open position.

2. An electrical apparatus and enclosure therefor as recited in claim 1 wherein said electrical apparatus comprises a digital electronic apparatus.

3. An electrical apparatus and enclosure therefor as recited in claim 2 further comprising a pressure sensitive screen coupled to said digital electronic apparatus that defines at least a portion of said user interface region.

4. An electrical apparatus and enclosure therefor as recited in claim 2 wherein said user interface region includes a plurality of buttons attached to said digital electronic apparatus.

5. An electrical apparatus and enclosure therefor as recited in claim 1 wherein said hinge is coupled to one of said side surfaces of said housing.

6. An electrical apparatus and enclosure therefor as recited in claim 5 wherein said hinge is a compound hinge comprising a first hinge assembly coupled to a second hinge assembly by a linking portion, said first hinge assembly being coupled to said cover and said second hinge assembly being coupled to said side surface.

7. An electrical apparatus and enclosure therefor as recited in claim 6 wherein said second hinge assembly is coupled to approximately the middle of said side surface, and wherein said linking portion is approximately one half of a height of said side surface.

8. An electrical apparatus and enclosure therefor as recited in claim 7 wherein said side surface is provided with a communication port coupled to said digital electronic apparatus, and wherein said cover includes a open portion having no material therein for allowing access to said communication port in said open position, whereby said communication port is not covered by said cover in either said open or closed position.

9. An electrical apparatus and enclosure therefor as recited in claim 8 wherein said linking portion includes two link hinges, said link hinges being positioned apart such that said open portion is provided between said link hinges.

10. An electrical apparatus and enclosure therefor as recited in claim 1 further comprising a release button coupled to said first housing catch member which, when activated, is operative to disengage said first housing catch member from said cover catch member.

11. An electrical apparatus and enclosure therefor as recited in claim 10 further comprising a spring member disposed between said cover and said top surface of said housing to urge said cover away from said top surface when in said closed position, whereby said spring member provides a tension between said cover catch member and said first housing catch member and causes said second portion of said cover to move from said top surface of said housing when said first housing catch member is disengaged from said cover catch member.

12. An electrical apparatus and enclosure therefore as recited in claim 10 wherein said release button and said first housing catch member are formed as a unitary member.

13. An electrical apparatus and enclosure therefor as recited in claim 11 wherein a pressure on said release button causes a withdrawal of said first housing catch member from engagement with said cover catch member.

14. An enclosure for an electrical apparatus comprising:
   a housing including top and bottom surfaces and a plurality of side surfaces, said housing defining an internal volume;
   a cover having a first portion coupled to said housing by a hinge such that said cover can be moved between a closed position substantially overlaying a user interface region and an open position substantially overlaying a portion of said bottom surface of said housing, whereby said cover protects said user interface region when in said closed position and exposes said user interface region for use when in said open position;
   a cover catch member coupled to a second portion of said cover;
   a first housing catch member coupled to said housing and operative to engage said cover catch member when said cover is in said closed position; and
   a second housing catch member coupled to said housing and operative to engage said cover catch member at said open position.

15. An enclosure as recited in claim 14 wherein said hinge is coupled to one of said side surfaces of said housing.

16. An enclosure as recited in claim 15 wherein said hinge is a compound hinge comprising a first hinge assembly coupled to a second hinge assembly by a linking portion, said first hinge assembly being coupled to said cover and said second hinge assembly being coupled to said side surface.

17. An enclosure as recited in claim 16 wherein said second hinge assembly is coupled to approximately the middle of said side surface, and wherein said linking portion is approximately one half of a height of said side surface.

18. An enclosure as recited in claim 14 further comprising a release button coupled to said first housing catch member which, when activated, is operative to disengage said first housing catch member from said cover catch member.

19. An enclosure as recited in claim 18 further comprising a spring member disposed between said cover and said top surface of said housing to urge said cover away from said top surface when in said closed position, whereby said spring member provides a tension between said cover catch member and said first housing catch member and causes said second portion of said cover to move from said top surface of said housing when said first housing catch member is disengaged from said cover catch member.

20. An enclosure as recited in claim 18 wherein said release button and said first housing catch member are formed as a unitary member.

21. An enclosure as recited in claim 20 wherein a pressure on said release button causes a withdrawal of said first housing catch member from engagement with said cover catch member.

22. A method for opening the cover of a hand-held computer comprising the steps of:
   engaging a first catch member coupled to a first end of a movable, protective cover of a hand-held computer with a second catch member of a housing of the hand-held computer to latch the protective cover over a display screen of said hand-held computer;
   urging said first catch member and said second catch member apart with a spring such that a latch comprising said first and second catch members is under tension;
   separating said first catch member from said second catch member to permit said first end of said cover to move from said display screen due to said tension; and
   engaging said first catch member with a third catch member of said housing of said hand-held computer to prevent said cover from covering said display screen.

23. A method as recited in claim 22 wherein said step of separating said first catch member from said second catch member is accomplished by pressing a button coupled to said second catch member such that said first catch member is moved away from said second catch member.

24. A method as recited in claim 23 wherein said button and said second catch member move in opposite directions.

25. A method as recited in claim 24 further comprising the step of releasing said first catch member with said third catch member such that said cover may be repositioned over said screen.

26. An electrical apparatus and enclosure therefor comprising:
   a housing including top and bottom surfaces and a plurality of side surfaces, said housing defining an internal volume;
   an electrical apparatus disposed within said internal volume of said housing such that said housing and said apparatus provide a user interface region proximate to said top surface;
   a cover having a first portion coupled to said housing by a first hinge such that said cover can be moved between a closed position substantially overlaying said user interface region and an open position substantially overlaying a portion of said bottom surface of said housing, whereby said cover protects said user interface region when in said closed position and exposes said user interface region for use when in said open position, and wherein said first hinge is a compound hinge comprising a first hinge assembly coupled to a second hinge assembly by a linking portion, said first hinge assembly being coupled to said cover and said second hinge assembly being coupled to approximately the middle of a side surface of said housing, wherein said linking portion is approximately one half of a height of said side surface;
   a communication port coupled to said electrical apparatus and provided in said side surface, wherein said cover includes a open portion having no material therein for allowing access to said communication port in said open position, whereby said communication port is not covered by said cover in either said open or closed position;
   a cover catch member coupled to a second portion of said cover;
   a first housing catch member coupled to said housing and operative to engage said cover catch member when said cover is in said closed position; and
   a second housing catch member coupled to said housing and operative to engage said cover catch member at said open position.

27. An electrical apparatus and enclosure therefor as recited in claim 26 wherein said linking portion includes two link hinges, said link hinges being positioned apart such that said open portion is provided between said link hinges.

* * * * *